(12) United States Patent
Lien et al.

(10) Patent No.: US 11,742,000 B2
(45) Date of Patent: Aug. 29, 2023

(54) CIRCUIT MODULE WITH IMPROVED LINE LOAD

(71) Applicant: M31 TECHNOLOGY CORPORATION, Hsinchu County (TW)

(72) Inventors: Nan-Chun Lien, Hsinchu County (TW); Li-Wei Chu, Hsinchu County (TW); Ting-Wei Chang, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 1 day.

(21) Appl. No.: 17/521,894

(22) Filed: Nov. 9, 2021

(65) Prior Publication Data
US 2023/0040348 A1    Feb. 9, 2023

(30) Foreign Application Priority Data
Aug. 3, 2021    (TW) .................................. 110128541

(51) Int. Cl.
*G11C 5/02*    (2006.01)
*G11C 7/10*    (2006.01)

(52) U.S. Cl.
CPC ............ *G11C 5/025* (2013.01); *G11C 7/1057* (2013.01); *G11C 7/1084* (2013.01)

(58) Field of Classification Search
CPC ...... G11C 5/025; G11C 7/1057; G11C 7/1084
USPC ...................................................... 365/185.11
See application file for complete search history.

(56) References Cited

U.S. PATENT DOCUMENTS 6,134,163 A    10/2000  Takahashi
9,337,842 B1 *  5/2016  Lee ................ H03K 19/018514

FOREIGN PATENT DOCUMENTS

CN    101866580 A   * 10/2010

OTHER PUBLICATIONS

Office Action issued by Taiwan Intellectual Property Office dated May 12, 2022.

* cited by examiner

*Primary Examiner* — Huan Hoang
(74) *Attorney, Agent, or Firm* — WPAT, P.C

(57) ABSTRACT

A circuit module with improved line load, may comprise a first line, a first switch, a second line, a second switch and a second driver. The first switch may be on and off to conduct and stop conducting between the first line and a first node. The second switch may be on and off to conduct and stop conducting between the second line and the first node. The second driver, coupled to the second line, may be enabled to drive the second line according to a voltage of a second node, and may be disabled to stop driving the second line. The voltage of the second node may be controlled by a voltage of the first node. When the first switch is on, the second switch may be off. When the second switch is off, the second driver may be enabled.

20 Claims, 9 Drawing Sheets

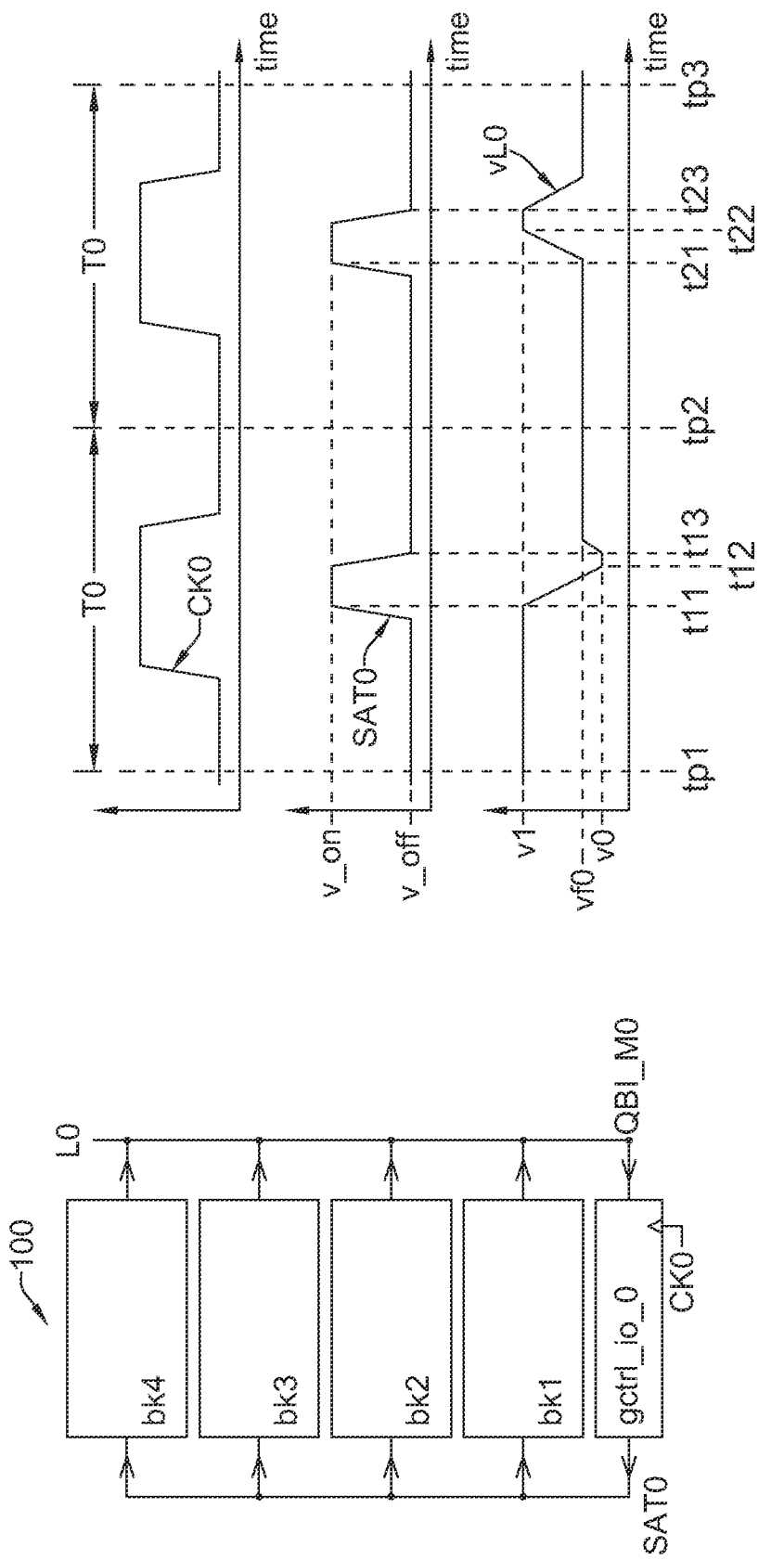
(PRIOR ART)
FIG. 1b
(PRIOR ART)
FIG. 1a

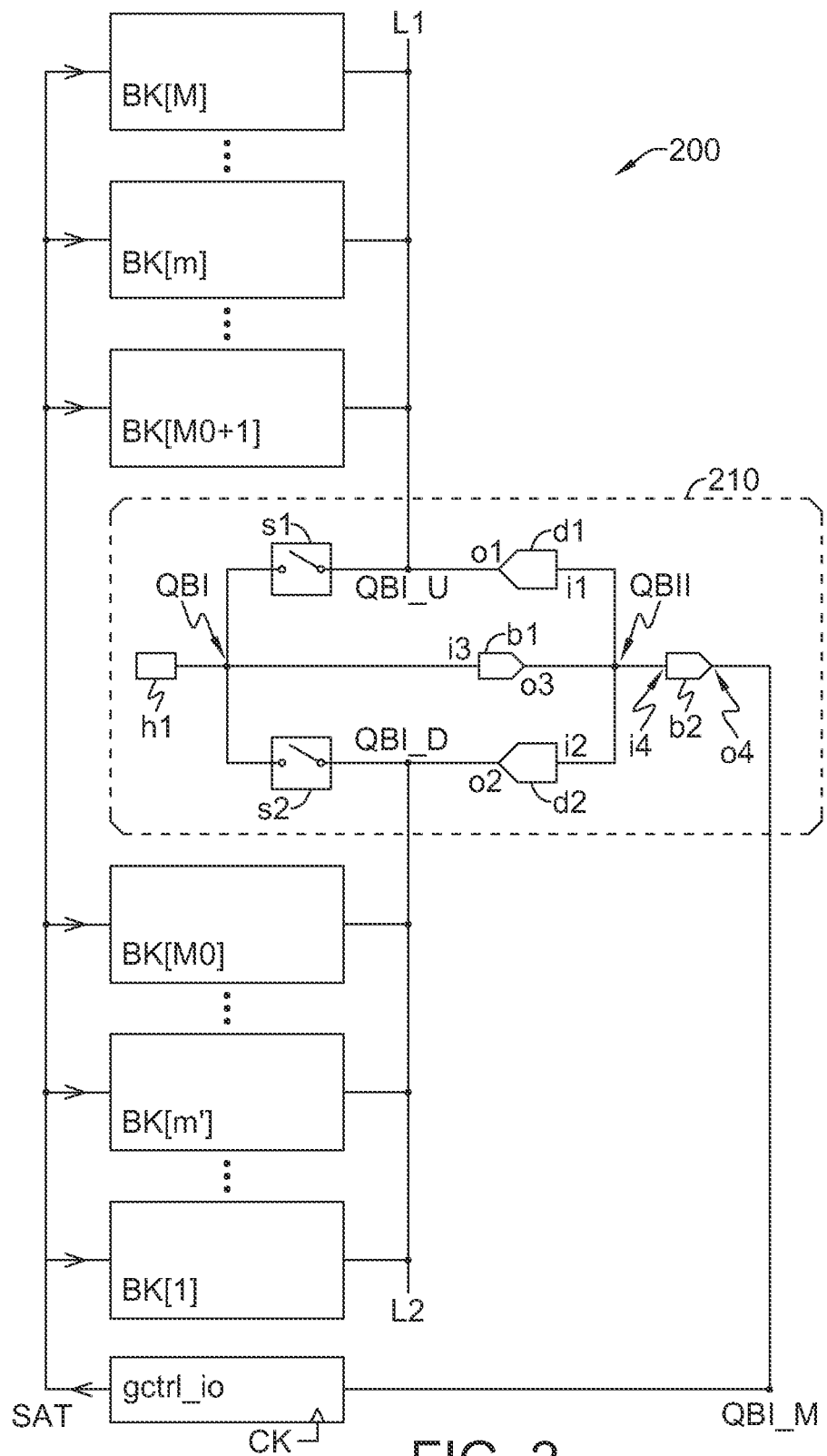
FIG. 2

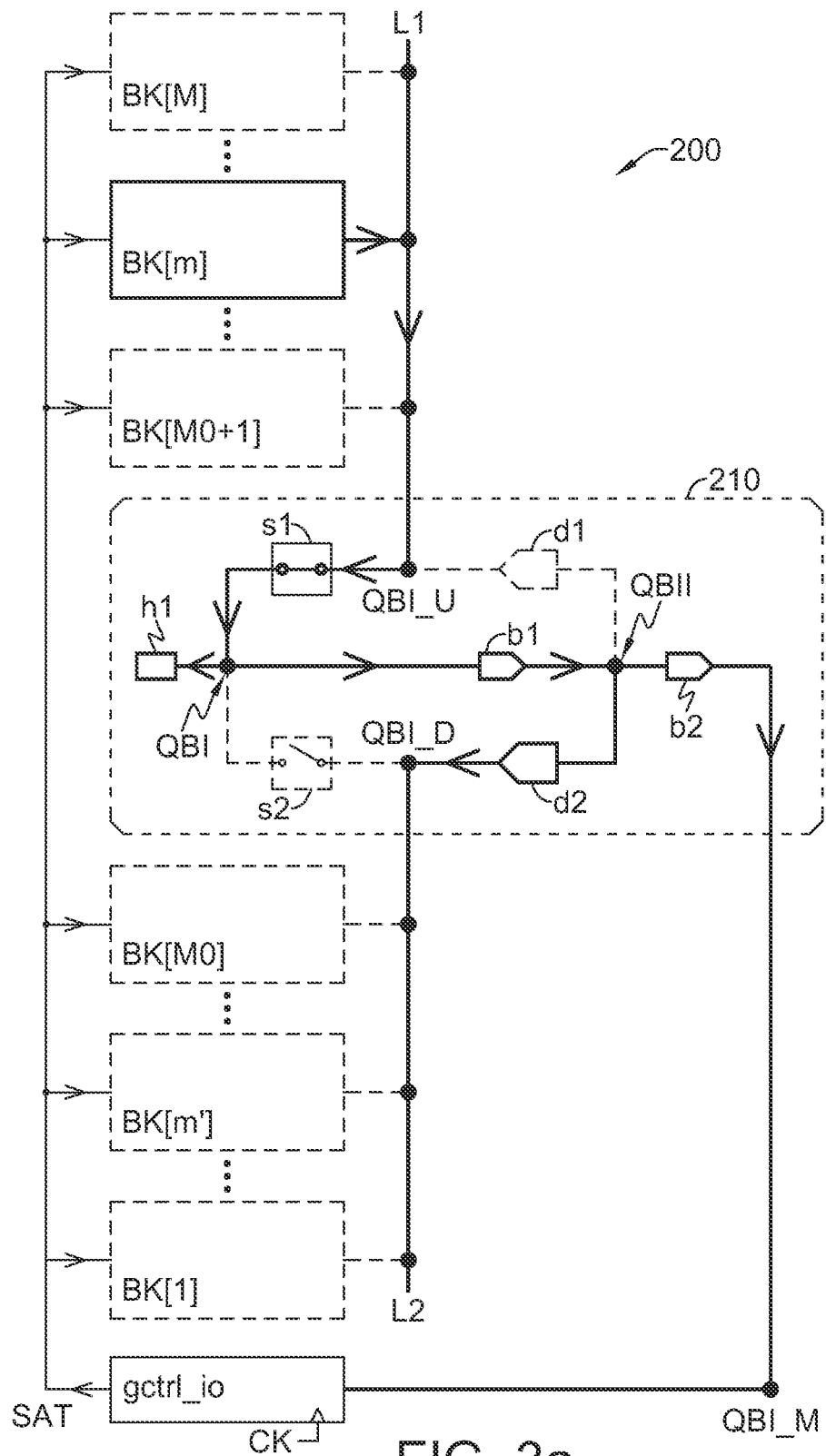
FIG. 3a

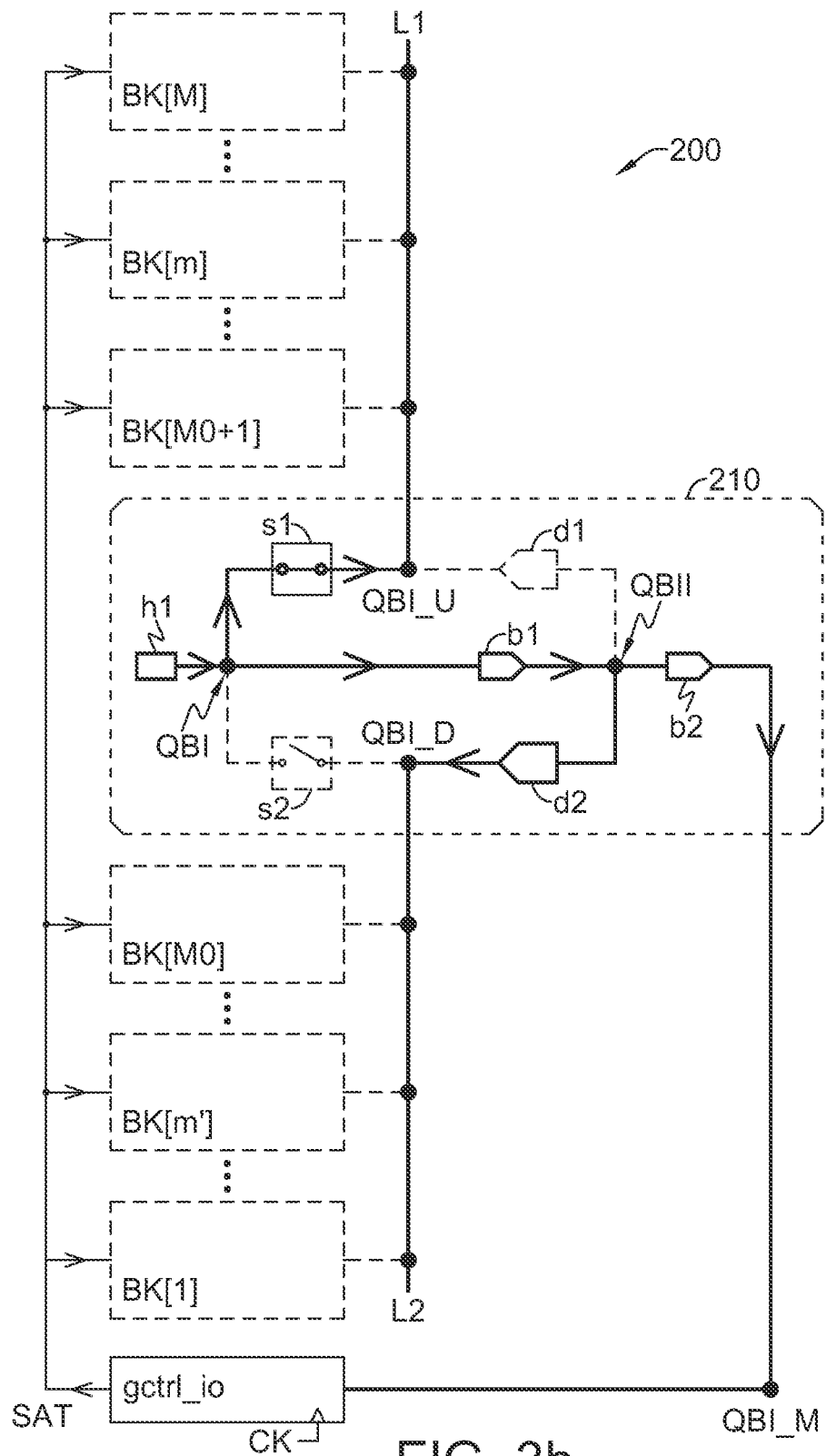
FIG. 3b

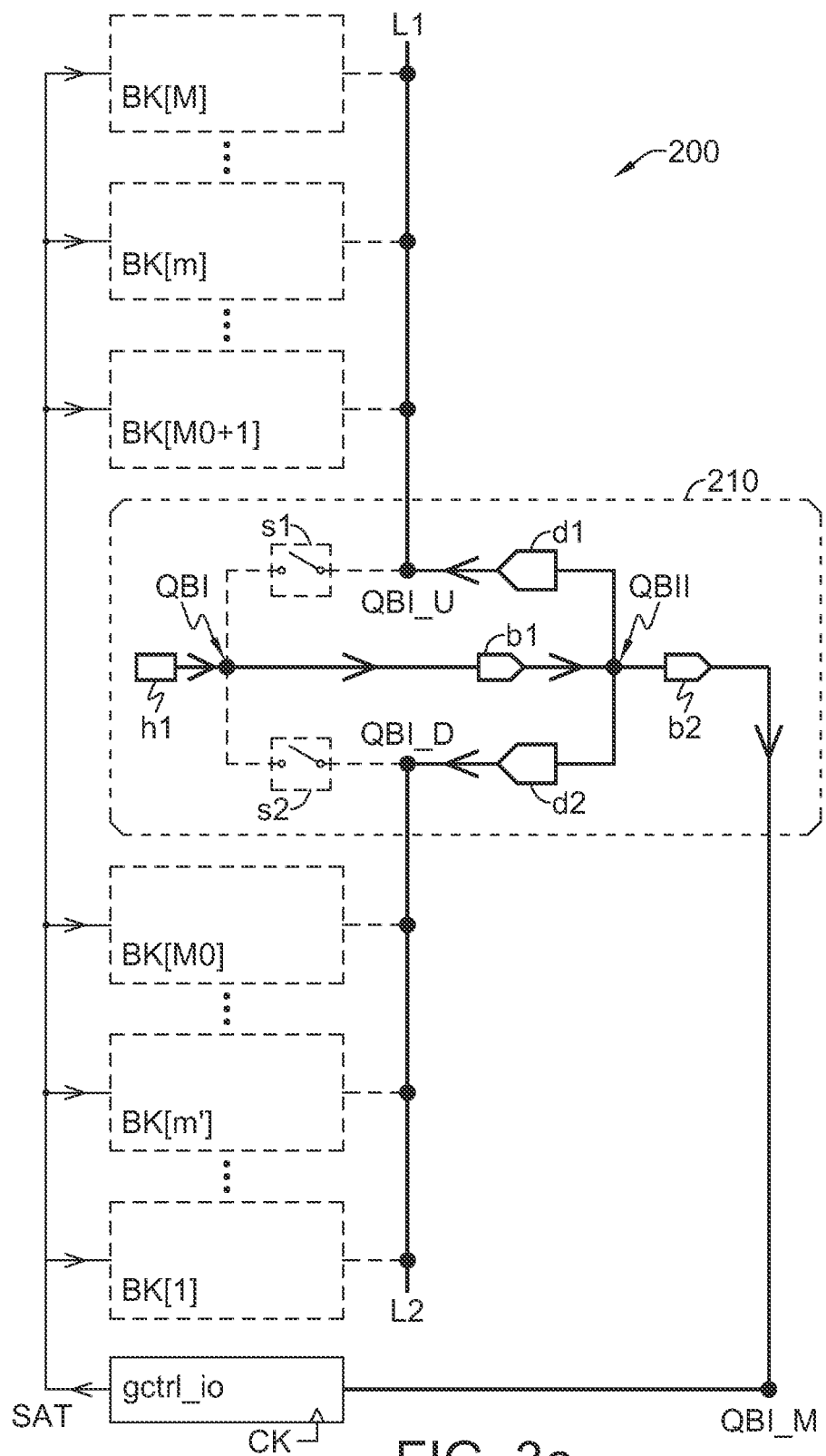
FIG. 3c

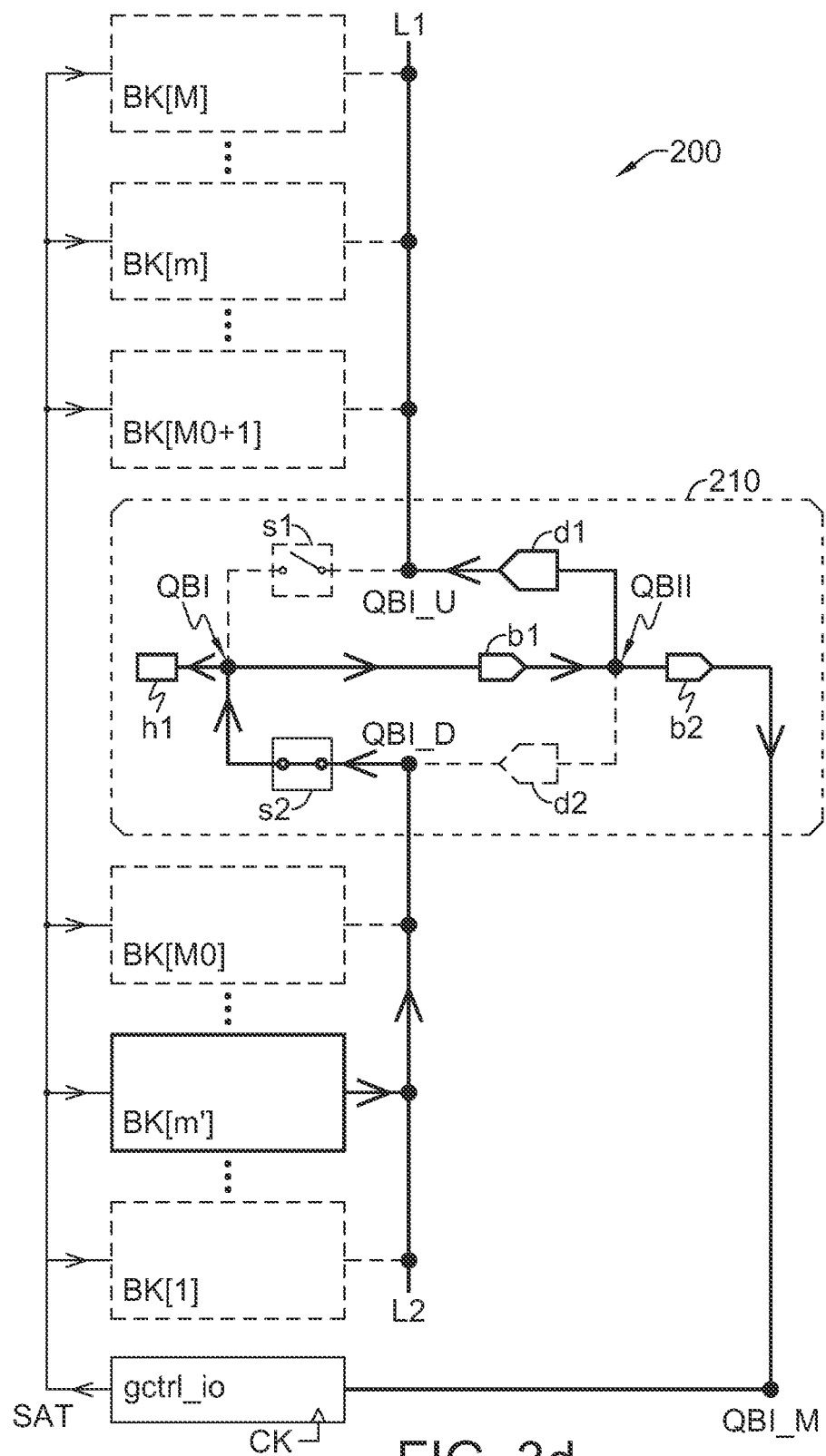
FIG. 3d

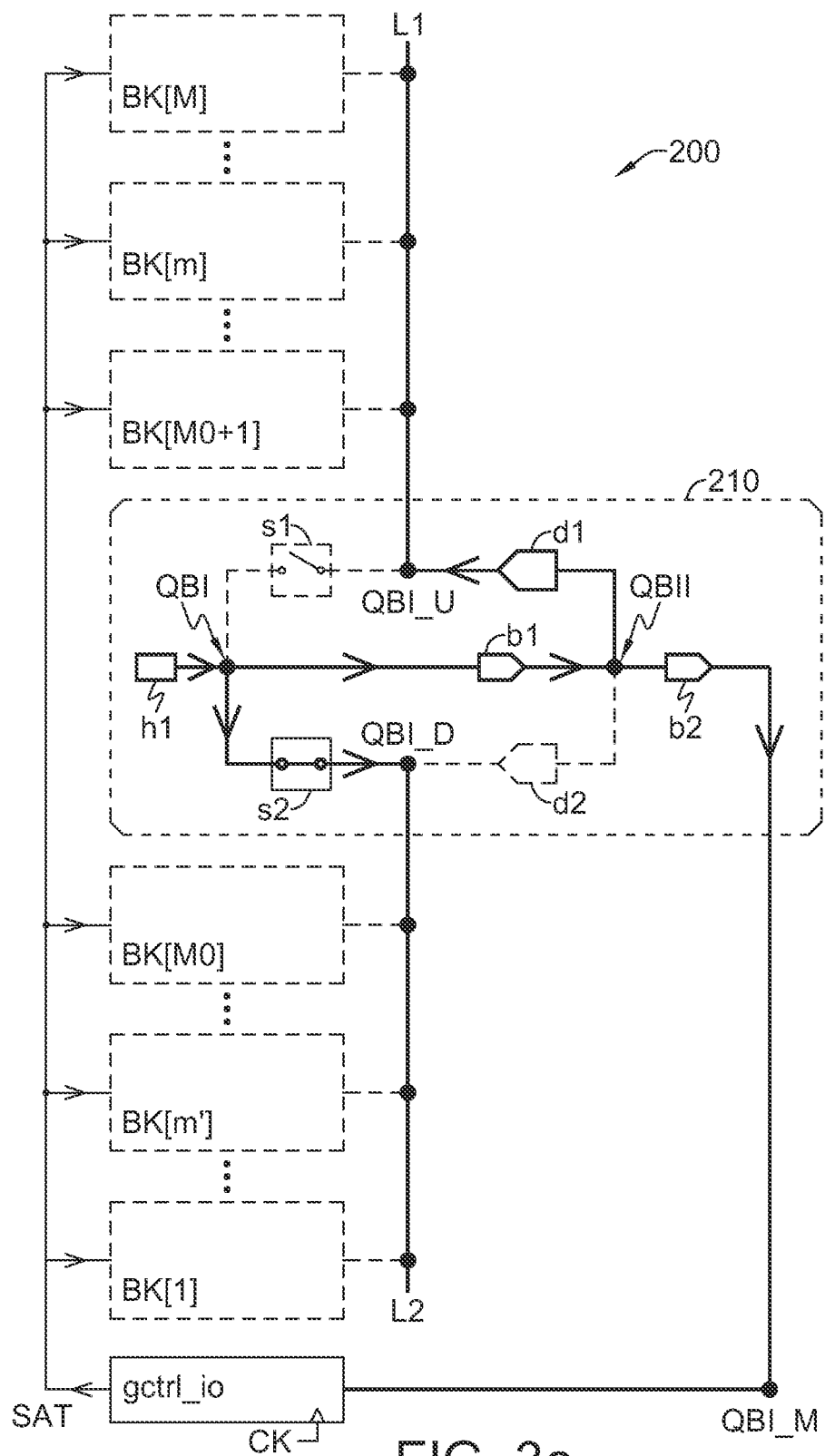
FIG. 3e

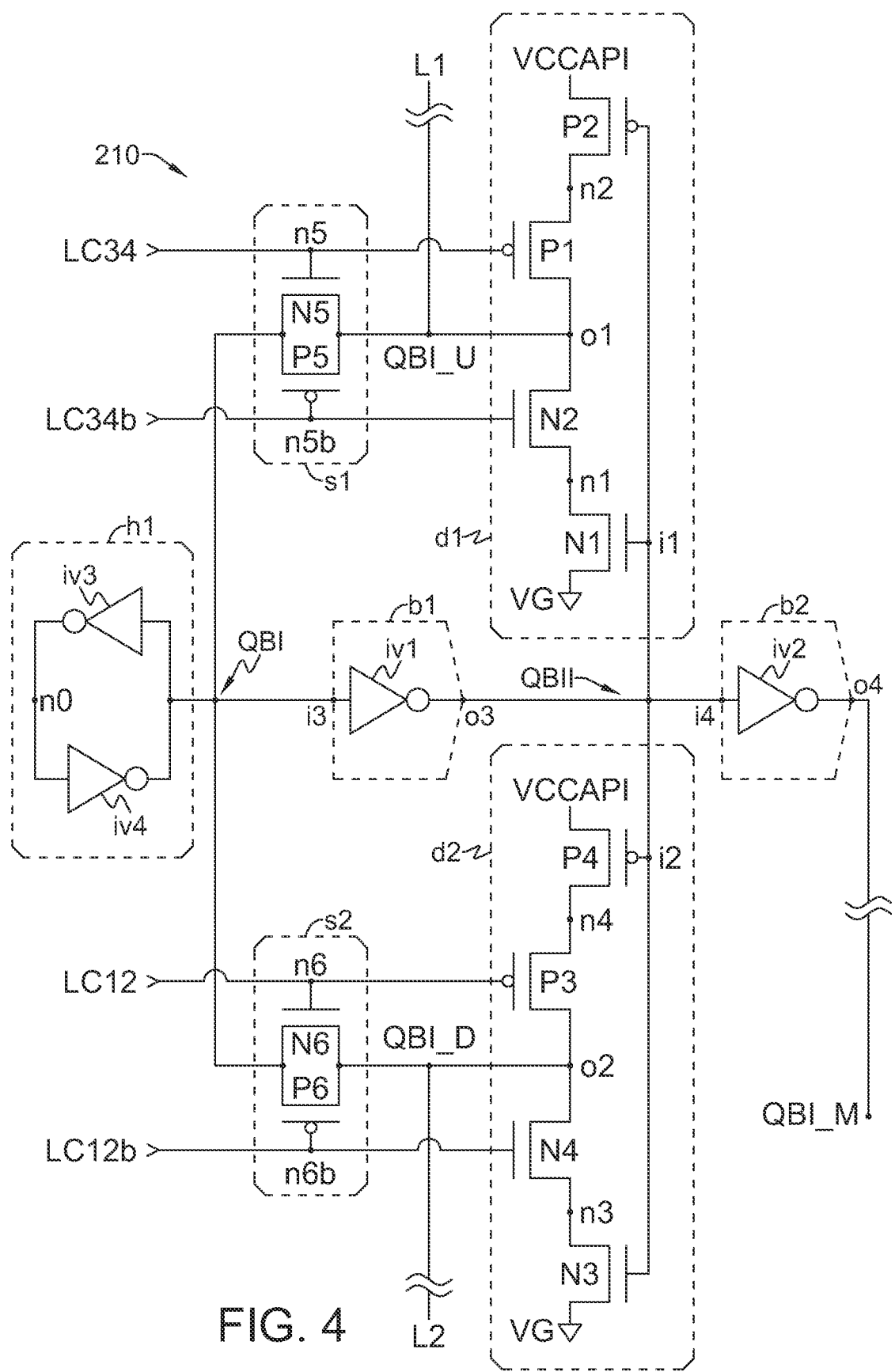
FIG. 4

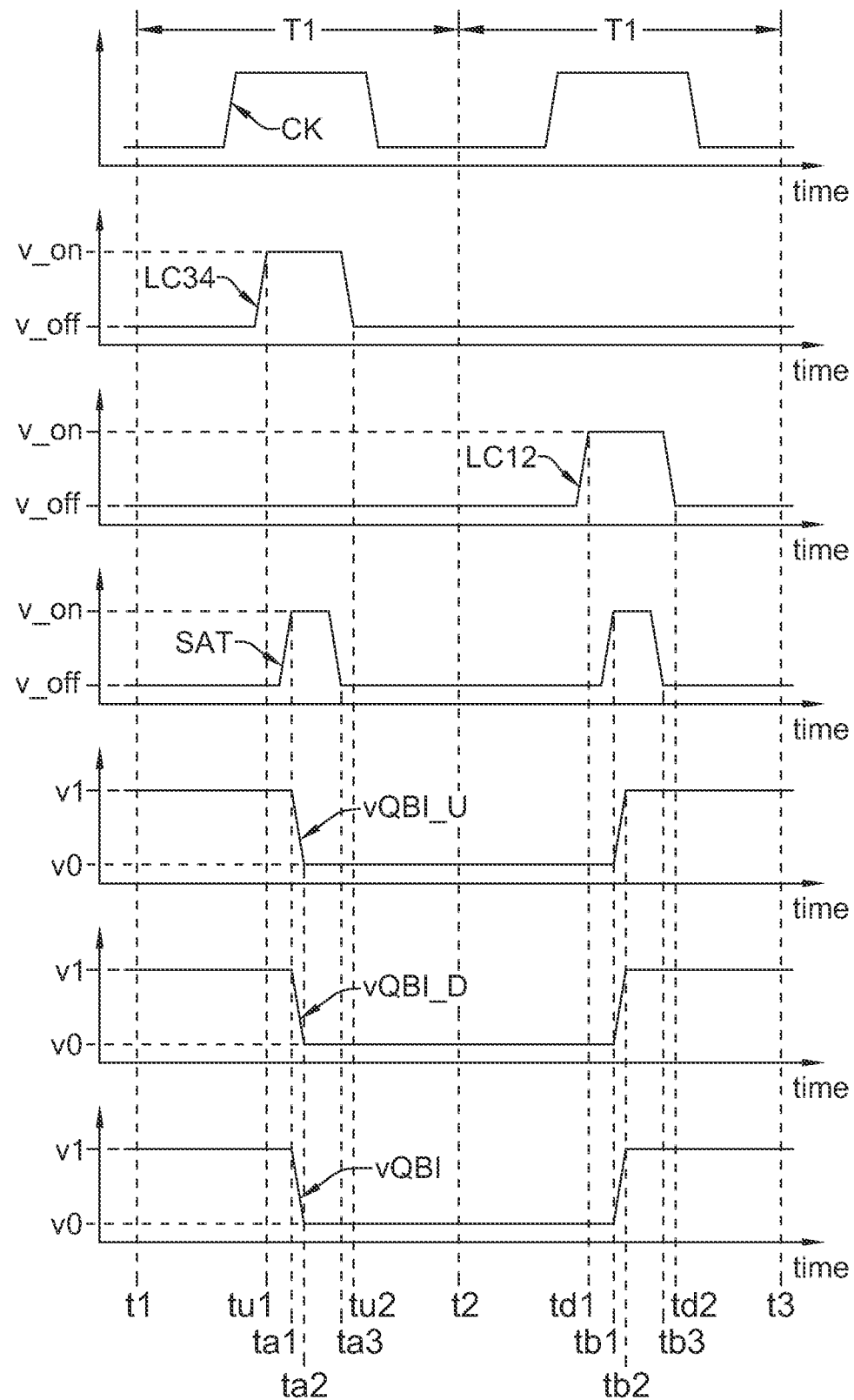
FIG. 5

CIRCUIT MODULE WITH IMPROVED LINE LOAD

This application claims the benefit of Taiwan application Serial No. 110128541, filed Aug. 3, 2021, the subject matter of which is incorporated herein by reference.

FIELD OF THE INVENTION

The present invention relates to a circuit module with improved line load, and more particularly, to a circuit module having a middle circuit and different short lines for organizing multiple internal circuit blocks to different groups, wherein: when a signal (data) is transmitted via one of the short lines, the middle circuit may latch said signal and may drive said signal to other ones of the short lines.

BACKGROUND OF THE INVENTION

Various circuit modules, such as memory modules, are essential building blocks of integrated circuits (semiconductor chips).

FIGS. 1a and 1b respectively depict a conventional memory module 100 according to a prior art, and timing/waveforms of related signals. As shown in FIG. 1a, the conventional memory module 100 includes memory banks bk1 to bk4, a long line L0 and a control-input-output circuit gctrl_io_0. The line L0 extends across the memory banks bk1 to bk4 to be coupled to the memory banks bk1 to bk4, and is further coupled to the control-input-output circuit gctrl_io_0 at a node QBI_M0. Via the line L0, the memory banks bk1 to bk4 can transmit stored data to the control-input-output circuit gctrl_io_0. The control-input-output circuit gctrl_io_0 controls operation timing of the memory module 100 according to a clock CK0; said operation timing control includes: providing a signal SAT0 to the memory banks bk1 to bk4 to control data transmission timing of the memory banks bk1 to bk4.

In FIG. 1b, a cycle T0 represents a period of the clock CK0, a waveform vL0 is a voltage waveform of the node QBI_M0 of the line L0. When one of the memory banks bk1 to bk4 transmits data to the control-input-output circuit gctrl_io_0, said one of the memory banks bk1 to bk4 drives a voltage of the line L0 according to contents of said data when the signal SAT0 is at a voltage v_on, and stops driving the line L0 when the signal SAT0 switches to another voltage v_off. For example, in a cycle T0 from time points tp1 to tp2, the signal SAT0 switches from the voltages v_off to v_on at a time point t11, and switches back from the voltages v_on to v_off at a time point t13; accordingly, assuming that the memory bank bk2 desires to transmit one-bit data of digital 0 to the control-input-output circuit gctrl_io_0 during this cycle, then the memory bank bk2 will start to drive the line L0 at the time point t11, and will pull down the voltage of the line L0 to a voltage v0 representing digital 0 later at a time point t12, as shown by the waveform vL0. According to the voltage of the line L0, the control-input-output circuit gctrl_io_0 determines contents of the one-bit data transmitted by the memory bank bk2. After the time point t13, as the signal SAT0 returns to the voltage v_off, the memory bank bk2 (and other memory banks bk1, bk3 and bk4) will stop driving the line L0.

Similarly, in a later cycle T0 from time points tp2 to tp3, the signal SAT0 switches from the voltage v_off to the voltage v_on at a time point t21, and switches back to the voltage v_off at a time point t23; assuming that the memory bank bk3 desires to transmit one-bit data of digital 1 to the control-input-output circuit gctrl_io_0 during this cycle, the memory bank bk3 will drive the line L0 after the time point t21, and will pull up the voltage of the line L0 to a voltage v1 representing digital 1 later at a time point t22. After the time point t23, the memory bank bk3 (and other memory banks bk1, bk2 and bk4) will stop driving the line L0 since the signal SAT0 has returned to the voltage v_off.

Disadvantages of said prior art can be briefly described as follows. First, because the line L0 needs to extend across all four memory banks bk1 to bk4, a length of the line L0 will be very long; for example, if each of the memory banks includes a memory array of 512 word lines, then the line L0 needs to extend across 512*4=2048 word lines. Due to the long length of the line L0, an equivalent line load of the line L0 will be high, time for anyone of the memory banks bk1 to bk4 to drive the line L0 to a desired voltage (e.g., from the time points t11 to t12 or t21 to t22) will be long, and speed (rate) of data access will therefore be low. Besides, driver circuitry (not shown) embedded in each of the memory banks bk1 to bk4 for driving the line L0 will need a larger layout area to satisfy higher required driving ability.

Furthermore, after the signal SAT0 switches from the voltage v_off to v_on (e.g., at the time points t11 and t21) and therefore one of the memory banks bk1 to bk4 starts to drive the line L0, once the signal SAT0 switches back from the voltages v_on to v_off (e.g., at the time points t13 and t23), the voltage of the line L0 will no longer be driven, and will therefore start to be floating. As shown in FIG. 1b, during the time points t13 to t21, because the signal SAT0 is at the voltage v_off, all the memory banks bk1 to bk4 do not drive the line L0, and the voltage of the line L0 will therefore drift to an uncertain voltage vf0 between the voltages v0 and v1, instead of keeping at the voltage v0 or v1; consequently, data hold-time at the node QBI_M0 will be unsatisfactorily insufficient.

SUMMARY OF THE INVENTION

Therefore, an object of the invention is providing a circuit module (e.g., 200 in FIG. 2) with improved line load. The circuit module may include a first line and a second line (e.g., L1 and L2 in FIGS. 2 and 4), a first switch and a second switch (e.g., s1 and s2) and a second driver (e.g., d2). The first switch may be coupled between the first line and a first node (e.g., QBI), and may be on and off to conduct and stop conducting (e.g., to connect and disconnect) between the first line and the first node. The second switch may be coupled between the second line and the first node, and may be on and off to conduct and stop conducting between the second line and the first node. The second driver may include a second-driver input terminal (e.g., i2) and a second-driver output terminal (e.g., o2) respectively coupled to a second node (e.g., QBII) and the second line; the second driver may be enabled to drive the second line according to a voltage of the second node, and may be disabled to stop driving the second line. The voltage of the second node may be controlled by a voltage of the first node. When the first switch is on, the second switch may be off; when the second switch is on, the first switch may be off. When the second switch is off, the second driver may be enabled; when the second switch is on, the second driver may be disabled.

In an embodiment, the circuit module may further include a buffer (e.g., b1 in FIGS. 2 and 4). The buffer may include a buffer input terminal (e.g., i3) and a buffer output terminal (e.g., o3) respectively coupled to the first node and the second node. In an embodiment, the buffer may further include a first inverter (e.g., iv1 in FIG. 4) coupled between the buffer input terminal and the buffer output terminal.

In an embodiment, the circuit module may further include one or more first circuit blocks (e.g., BK[M0+1] to BK[M] in FIG. 2) parallelly coupled to the first line. When one of said one or more first circuit blocks transmits data, the one of said one or more first circuit blocks may drive the first line according to the data (e.g., at a time point ta1, FIG. 5) after the first switch is on (e.g., at a time point tu1), and may stop driving the first line (e.g., at a time point ta3) before the first switch turns off (e.g., at a time point tu2). In an embodiment, each of said one or more first circuit blocks may be a memory bank. In an embodiment, the circuit module may further include a latch (e.g., h1 in FIGS. 2 and 4) coupled to the first node. After the one of said one or more first circuit blocks stops driving the first line (e.g., after the time point ta3, FIG. 5), the latch may maintain the voltage of the first node such that the voltage of the first node may not be floating.

In an embodiment, the latch may include a third inverter and a fourth inverter (e.g., iv3 and iv4 in FIG. 4). The third inverter may include a third-inverter input terminal and a third-inverter output terminal respectively coupled to the first node and an internal node (e.g., n0). The fourth inverter may include a fourth-inverter input terminal and a fourth-inverter output terminal respectively coupled to the internal node and the first node.

In an embodiment, the first switch and the second switch may be both off during an interval (e.g., from time points tu2 to t2 in FIG. 5).

In an embodiment, the circuit module may further include one or more second circuit block (e.g., BK[1] to BK[M0] in FIG. 2) parallelly coupled to the second line. When one of said one or more second circuit blocks transmits data, the one of said one or more second circuit blocks may drive the second line according to the data (e.g., at a time point tb1, FIG. 5) after the second switch is on (e.g., at a time point td1), and may stop driving the second line (e.g., at a time point tb3) before the second switch turns off (e.g., at a time point td2). In an embodiment, each of said one or more second circuit blocks may be a memory bank.

In an embodiment, the circuit module may further include a first driver (e.g., d1 in FIGS. 2 and 4). The first driver may include a first-driver input terminal (e.g., i1) and a first-driver output terminal (e.g., o1) respectively coupled to the second node and the first line. The first driver may be enabled to drive the first line according to the voltage of the second node, and may be disabled to stop driving the first line. When the first switch is off, the first driver may be enabled; when the first switch is on, the first driver may be disabled.

In an embodiment (e.g., FIG. 4), the first driver may further include a first transistor, a second transistor, a seventh transistor and an eighth transistor (e.g., N1, N2, P1 and P2 in FIG. 4). The first transistor may include a first controlled terminal (e.g., a gate terminal) and a first channel terminal (e.g., at a node n1). The second transistor may include a second controlled terminal and two second channel terminals (e.g., a source terminal and a drain terminal), and the two second channel terminals may be coupled to the first channel terminal and the first-driver output terminal respectively. The eighth transistor may include an eighth controlled terminal and an eighth channel terminal (e.g., at a node n2). The seventh transistor may include a seventh controlled terminal and two seventh channel terminals, and the two seventh channel terminals may be coupled to the eighth channel terminal and the first-driver output terminal respectively. One of the first controlled terminal and the second controlled terminal may be coupled to the first-driver input terminal, and the other one of the first controlled terminal and the second controlled terminal may be coupled to a first inverse selection signal (e.g., LC34b). One of the seventh controlled terminal and the eighth controlled terminal may be coupled to the first-driver input terminal, and the other one of the seventh controlled terminal and the eighth controlled terminal may be coupled to a first selection signal (e.g., LC34); the first selection signal and the first inverse selection signal may be mutually inverse.

In an embodiment (e.g., FIG. 4), the first switch may include a fifth transistor (e.g., N5 in FIG. 4) and/or an eleventh transistor (e.g., P5). The fifth transistor may include a fifth controlled terminal and two fifth channel terminals respectively coupled to the first selection signal, the first node and the first line. The eleventh transistor may include an eleventh controlled terminal and two eleventh channel terminals respectively coupled to the first inverse selection signal, the first node and the first line.

In an embodiment (e.g., FIG. 4), the second driver may further include a third transistor, a fourth transistor, a ninth transistor and a tenth transistor (e.g., N3, N4, P3 and P4 in FIG. 4). The third transistor may include a third controlled terminal and a third channel terminal (e.g., at a node n3). The fourth transistor may include a fourth controlled terminal and two fourth channel terminals, and the two fourth channel terminals may be coupled to the third channel terminal and the second-driver output terminal respectively. The tenth transistor may include a tenth controlled terminal and a tenth channel terminal (e.g., at a node n4). The ninth transistor may include a ninth controlled terminal and two ninth channel terminals, and the two ninth channel terminals may be coupled to the tenth channel terminal and the second-driver output terminal respectively. One of the third controlled terminal and the fourth controlled terminal may be coupled to the second-driver input terminal, and the other one of the third controlled terminal and the fourth controlled terminal may be coupled to a second inverse selection signal (e.g., LC12b). One of the ninth controlled terminal and the tenth controlled terminal may be coupled to the second-driver input terminal, and the other one of the ninth controlled terminal and the tenth controlled terminal may be coupled to a second selection signal (e.g., LC12); the second selection signal and the second inverse selection signal may be mutually inverse.

In an embodiment (e.g., FIG. 4), the second switch may include a sixth transistor (e.g., N6 in FIG. 4) and/or a twelfth transistor (e.g., P6). The sixth transistor may include a sixth controlled terminal and two sixth channel terminals respectively coupled to the second selection signal, the first node and the second line. The twelfth transistor may include a twelfth controlled terminal and two twelfth channel terminals respectively coupled to the second inverse selection signal, the first node and the second line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

(prior art) FIGS. 1a and 1b respectively depict a conventional memory module and timing/waveforms of related signals;

FIG. 2 depicts a circuit module according to an embodiment of the invention; the circuit module may include a middle circuit;

FIGS. 3a to 3e illustrate operations of the circuit module shown in FIG. 2 according to an embodiment of the invention;

FIG. 4 illustrates a circuitry embodiment of the middle circuit shown in FIG. 2; and FIG. 5 illustrates timing/waveforms of related signals shown in FIGS. 2 and 4.

DETAILED DESCRIPTION OF PREFERRED EMBODIMENTS

FIG. 2 depicts a circuit module 200 according to an embodiment of the invention; the circuit module 200 may include a number M of circuit blocks BK[1] to BK[M] and a control-input-output circuit gctrl_io; to implement the invention, the circuit module 200 may further include a middle circuit 210 and two lines L1 and L2. For example, the circuit module 200 may be a memory module, each of the circuit blocks BK[1] to BK[M] may be a memory bank, and may include a memory array (not shown) such as a static random access memory array of 512 word lines. The circuit blocks BK[1] to BK[M] may be organized to two groups, wherein the circuit blocks BK[M0+1] to BK[M] ((M0+1) <M) may belong to a first group, may be parallelly coupled to the line L1 and may therefore be coupled to the middle circuit 210 at a node QBI_U of the line L1; the circuit blocks BK[1] to BK[M0] may belong to a second group, may be parallelly coupled to the line L2 and may therefore be coupled to the middle circuit 210 at a node QBI_D of the line L2. The numbers M0 and M may be two predetermined integers; in an embodiment, the number M may be twice of the number M0 (M=2*M0). For example, the numbers M0 and M may respectively be 2 and 4; i.e., the circuit module 200 may include four circuit blocks BK[1] to BK[4], wherein the circuit blocks BK[3] and BK[4] may belong to one group, and may be parallelly coupled to the line L1; the circuit blocks BK[1] and BK[2] may belong to another group, and may be parallelly coupled to the line L2.

The middle circuit 210 may be coupled to the control-input-output circuit gctrl_io at a node QBI_M. The circuit blocks BK[1] to BK[M0] may transmit data to the control-input-output circuit gctrl_io via the line L2 and the middle circuit 210, and the circuit blocks BK[M0+1] to BK[M] may transmit data to the control-input-output circuit gctrl_io via the line L1 and the middle circuit 210. The control-input-output circuit gctrl_io may control operation timing of the circuit module 200 according to a clock CK, wherein said operation timing control may include: providing a signal SAT to the circuit blocks BK[1] to BK[M] to control data transmission timing of the circuit blocks BK[1] to BK[M].

As shown in FIG. 2, the middle circuit 210 may include two switches s1 and s2, two drivers d1 and d2, a latch h1 and two buffers b1 and b2. The switch s1 may be coupled between the node QBI_U of the line L1 and a node QBI, and may be on and off; when the switch s1 is on, the switch s1 may conduct (may connect) between the line L1 and the node QBI; when the switch s1 is off, the switch s1 may stop conducting (may disconnect) between the line L1 and the node QBI. The switch s2 may be coupled between the node QBI_D of the line L2 and the node QBI, and may be on and off; when the switch s2 is on, the switch s2 may conduct between the line L2 and the node QBI; when the switch s2 is off, the switch s2 may stop conducting between the line L2 and the node QBI.

The driver d1 may have an input terminal i1 and an output terminal o1 respectively coupled to a node QBII and the node QBI_U of the line L1. The driver d1 may be enabled and disabled; when the driver d1 is enabled, the driver d1 may drive a voltage of the line L1 according to a voltage of the node QBII; when the driver d1 is disabled, the driver d1 may stop driving the voltage of the line L1. The driver d2 may have an input terminal i2 and an output terminal o2 respectively coupled to the node QBII and the node QBI_D of the line L2. The driver d2 may be enabled and disabled; when the driver d2 is enabled, the driver d2 may drive a voltage of the line L2 according to the voltage of the node QBII; when the driver d2 is disabled, the driver d2 may stop driving the voltage of the line L2.

The buffer b1 may have an input terminal i3 and an output terminal o3 respectively coupled to the nodes QBI and QBII, and may drive the voltage of the node QBII according to a voltage of the node QBI, such that the voltage of the node QBII may be controlled by the voltage of the node QBI. The buffer b2 may have an input terminal i4 and an output terminal o4 respectively coupled to the nodes QBII and QBI_M, and may drive a voltage of the node QBI_M according to the voltage of the node QBII. The latch h1 may be coupled to the node QBI.

Following FIG. 2, FIGS. 3a to 3e illustrate operations of the circuit module 200 according to an embodiment of the invention. As shown in FIG. 3a, when the control-input-output circuit gctrl_io requests a circuit block BK[m] of the circuit blocks BK[M0+1] to BK[M] to transmit first data (not shown) to the control-input-output circuit gctrl_io, the switch s1 may be on, the switch s2 may be off, the driver d1 may be disabled, and the driver d2 may be enabled. After the switch s1 is on, the circuit block BK[m] may drive the voltage of the line L1 (and the voltage of the node QBI_U) according to contents of the first data; the switch s1 which is on may conduct the voltage of the node QBI_U to the node QBI, the latch h1 may latch the voltage of the node QBI, the buffer b1 may drive the voltage of the node QBII according to the voltage of the node QBI, and the buffer b2 may drive the voltage of the node QBI_M according to the voltage of the node QBII, so the control-input-output circuit gctrl_io may, according to the voltage of the node QBI_M, determine and thus receive the first data transmitted by the circuit block BK[m]. Meanwhile, the enabled driver d2 may drive the voltage of the line L2 according to the voltage of the node QBII, so the voltage of the line L2 may be controlled by the voltage of the line L1 (e.g., the voltage of the line L2 may be substantially equal to the voltage of the line L1).

As shown in FIG. 3b, when the circuit block BK[m] stops driving the line L1 and the rest of circuit blocks do not drive the lines L1 and L2, the switch s1 may be on, the switch s2 may be off, the driver d1 may be disabled and the driver d2 may be enabled. Via the node QBI and the switch s1 which is on, the voltages of the node QBI_U and the line L1 may be controlled by a voltage latched by the latch h1 (e.g., be substantially equal to the voltage latched by the latch h1). Via the buffer b1 and the enabled driver d2, the voltages of the node QBI_D and the line L2 may be controlled by the voltage latched by the latch h1 (e.g., be substantially equal to the voltage latched by the latch h1). Via the buffers b1 and b2, the voltage of the node QBI_M may also be controlled by the voltage latched by the latch h1 (e.g., be substantially equal to the voltage latched by the latch h1).

As shown in FIG. 3c, when all the circuit blocks BK[1] to BK[M] do not drive the lines L1 and L2, the switches s1 and s2 may also be both off, and the drivers d1 and d2 may both be enabled. Via the buffer b1 and the enabled driver d1, the voltages of the node QBI_U and the line L1 may be controlled by (e.g., be substantially equal to) the voltage latched by the latch h1. Via the buffer b1 and the enabled driver d2, the voltages of the node QBI_D and the line L2 may be controlled by (e.g., be substantially equal to) the voltage latched by the latch h1. Via the buffers b1 and b2, the voltage of the node QBI_M may also be controlled by (e.g., be substantially equal to) the voltage latched by the latch h1.

As shown in FIG. 3d, when the control-input-output circuit gctrl_io requests a circuit block BK[m'] of the circuit blocks BK[1] to BK[M0] to transmit second data (not shown) to the control-input-output circuit gctrl_io, the switch s2 may be on, the switch s1 may be off, the driver d2 may be disabled, and the driver d1 may be enabled. After the switch s2 is on, the circuit block BK[m'] may drive the voltage of the line L2 (and the voltage of the node QBI_D) according to contents of the second data; the switch s2 which is on may conduct the voltage of the node QBI_D to the node QBI, the latch h1 may latch the voltage of the node QBI, the buffer b1 may drive the voltage of the node QBII according to the voltage of the node QBI, and the buffer b2 may drive the voltage of the node QBI_M according to the voltage of the node QBII, so the control-input-output circuit gctrl_io may, according to the voltage of the node QBI_M, determine and thus receive the second data transmitted by the circuit block BK[m']. Meanwhile, the enabled driver d1 may drive the voltage of the line L1 according to the voltage of the node QBII, so the voltage of the line L1 may be controlled by (e.g., be substantially equal to) the voltage of the line L2.

As shown in FIG. 3e, when the circuit block BK[m'] stops driving the line L2 and the rest of circuit blocks do not drive the lines L1 and L2, the switch s1 may be off, the switch s2 may be on, the driver d1 may be enabled and the driver d2 may be disabled. Via the node QBI and the switch s2 which is on, the voltages of the node QBI_D and the line L2 may be controlled by (e.g., be substantially equal to) the voltage latched by the latch h1. Via the buffer b1 and the enabled driver d1, the voltages of the node QBI_U and the line L1 may be controlled by (e.g., be substantially equal to) the voltage latched by the latch h1. Via the buffers b1 and b2, the voltage of the node QBI_M may also be controlled by (e.g., be substantially equal to) the voltage latched by the latch h1.

Following FIG. 2, FIG. 4 illustrates circuitry of the middle circuit 210 according to an embodiment of the invention. The driver d1 may include transistors P1, P2, N1 and N2, the driver d2 may include transistors P3, P4, N3 and N4, the switch s1 may include transistors P5 and N5, and the switch s2 may include transistors P6 and N6. Each of the transistors P1 to P6 may be a p-channel metal-oxide-semiconductor transistor, and each of the transistors N1 to N6 may be an n-channel metal-oxide-semiconductor transistor. The buffer b1 may include an inverter iv1 (or an odd number of serially connected inverters). The buffer b2 may include an inverter iv2 (or an odd number of serially connected inverters). The latch h1 may include two inverters iv3 and iv4.

In the driver d1, the transistor N1 may include a controlled terminal (e.g., a gate terminal) and two channel terminals (e.g., a source terminal and a drain terminal) respectively coupled to the input terminal i1, a voltage VG (e.g., a ground voltage) and a node n1. The transistor N2 may include a controlled terminal and two channel termi-nals; the controlled terminal may be coupled to an inverse selection signal LC34b at a node n5b, and the two channel terminals may be respectively coupled to the node n1 and the output terminal o1. The transistor P1 may include a controlled terminal and two channel terminals; the controlled terminal may be coupled to a selection signal LC34 at a node n5, and the two channel terminals may be respectively coupled to a node n2 and the output terminal o1. The transistor P2 may include a controlled terminal and two channel terminals respectively coupled to the input terminal i1, a voltage VCCAPI (e.g., a supply voltage) and the node n2. The selection signal LC34 and the inverse selection signal LC34b may be mutually inverse.

In the driver d2, the transistor N3 may include a controlled terminal and two channel terminals respectively coupled to the input terminal i2, the voltage VG and a node n3. The transistor N4 may include a controlled terminal and two channel terminals; the controlled terminal may be coupled to an inverse selection signal LC12b at a node n6b, and the two channel terminals may be respectively coupled to the node n3 and the output terminal o2. The transistor P3 may include a controlled terminal and two channel terminals; the controlled terminal may be coupled to a selection signal LC12 at a node n6, and the two channel terminals may be respectively coupled to a node n4 and the output terminal o2. The transistor P4 may include a controlled terminal and two channel terminals respectively coupled to the input terminal i2, the voltage VCCAPI and the node n4. The selection signal LC12 and the inverse selection signal LC12b may be mutually inverse.

In the switch s1, the transistor N5 may include a controlled terminal and two channel terminals respectively coupled to the selection signal LC34, the node QBI and the node QBI_U of the line L1. The transistor P5 may include a controlled terminal and two channel terminals respectively coupled to the inverse selection signal LC34b, the node QBI and the node QBI_U of the line L1. In the switch s2, the transistor N6 may include a controlled terminal and two channel terminals respectively coupled to the selection signal LC12, the node QBI and the node QBI_D of the line L2. The transistor P6 may include a controlled terminal and two channel terminals respectively coupled to the inverse selection signal LC12b, the node QBI and the node QBI_D of the line L2. When the control-input-output circuit gctrl_io (FIG. 2) requests one of the circuit blocks BK[1] to BK[M] to transmit data, the selection signal LC34 may reflect whether said requested circuit block belongs to the first group (i.e., the circuit blocks BK[M0+1] to BK[M]), and the selection signal LC12 may reflect whether said requested circuit block belongs to the second group (i.e., the circuit blocks BK[1] to BK[M0]).

In the buffer b1, the inverter iv1 may include an input terminal and an output terminal respectively coupled to the input terminal i3 and the output terminal o3. In the buffer b2, the inverter iv2 may include an input terminal and an output terminal respectively coupled to the input terminal i4 and the output terminal o4. In the latch h1, the inverter iv3 may include an input terminal and an output terminal respectively coupled to the node QBI and a node n0, and the inverter iv4 may include an input terminal and an output terminal respectively coupled to the nodes n0 and QBI.

Following FIGS. 2, 3a to 3e and 4, FIG. 5 illustrates timing/waveforms of related signals in the circuit module 200 according to an embodiment of the invention. In FIG. 5, a cycle T1 may represent a period of the clock CK (FIG. 2), and waveforms vQBI_U, vQBI_D and vQBI may be voltage waveforms of the nodes QBI_U, QBI_D and QBI, respectively. In a cycle T1 from time points t1 to t2, assuming that the control-input-output circuit gctrl_io requests a circuit block BK[m] of the circuit blocks BK[M0+1] to BK[M] (FIG. 2) to transmit data, a voltage of the selection signal LC34 (FIG. 5) may switch from a voltage v_off to another voltage v_on at a time point tu1 to reflect that the requested circuit block BK[m] belongs to the first group, and a voltage of the selection signal LC12 may be the voltage v_off to reflect that the circuit block BK[m] does not belong to the second group.

When the selection signal LC34 is at the voltage v_off, the transistors N5 and P5 (FIG. 4) may be off, the transistors P1 and N2 may be on, so the switch s1 may be off and the driver d1 may be enabled. Similarly, when the selection signal LC12 is at the voltage v_off, the transistors N6 and P6 may be off, the transistors P3 and N4 may be on, so the switch s2 may be off and the driver d2 may be enabled. On the other hand, when the selection signal LC34 switches to the voltage v_on at the time point tu1, the transistors N5 and P5 may be on, the transistors P1 and N2 may be off, and therefore the switch s1 may be on, and the driver d1 may be disabled.

As shown in FIG. 5, after the selection signal LC34 switches to the voltage v_on at the time point tu1, the signal SAT may switch from the voltage v_off to the voltage v_on at a later time point ta1, and may then cause the circuit block BK[m] to start driving the voltage of the line Li according to the data desired to be transmitted. For example, if the circuit block BK[m] desires to transmit one-bit data of digital 0, then the circuit block BK[m] may start to drive the voltage of the line L1 (and the voltage of the node QBI_U) toward a voltage v0 representing digital 0 at the time point ta1, and may eventually cause the voltage of the node QBI_U to reach the voltage v0 at a later time point ta2, as shown by the waveform vQBI_U.

After the time point tu1, the switch s1 may be on, the switch s2 may be off, the driver di may be disabled and the driver d2 may be enabled, as shown in FIG. 3a. Hence, the voltage of the node QBI_U may be relayed to the node QBI via the switch s1 which is on, so the voltage of the node QBI may reflect the voltage of the node QBI_U, as shown by the waveform vQBI (FIG. 5). In addition, the buffer bi and the enabled driver d2 may cause the voltages of the node QBI_D and the line L2 to reflect the voltage of the node QBI, as shown by the waveform vQBI_D; furthermore, the buffers b1 and b2 may cause the voltage of the node QBI_M to also reflect the voltage of the node QBI. Therefore, when the line Li and the node QBI_U are driven to the voltage v0 at the time point ta2, the voltages of the nodes QBI, QBI_D, QBI_M and the line L2 may follow to be the voltage v0. Accordingly, the data of digital 0 transmitted on the line L1 by the circuit block BK[m] may be transmitted to the control-input-output circuit gctrl_io via the node QBI_M, and may be transmitted to the line L2 via the node QBI_D. At the time point ta2, as the nodes QBI_U and QBI are driven to the voltage v0, the voltage v0 of the node QBI may be latched by the latch h1.

At a time point ta3 after the time point ta2, the signal SAT may switch back to the voltage v_off from the voltage v_on, so the circuit block BK[m] may stop driving the line L1. However, as shown in FIG. 3b, because the latch h1 has latched the voltage v0, the voltage of the node QBI may be kept at the voltage v0; the switch s1 which is on may cause the voltages of the node QBI_U and the line L1 to reflect the voltage of the node QBI, the buffer b1 and the enabled driver d2 may cause the voltages of the node QBI_D and the line L2 to reflect the voltage of the node QBI, and the buffers b1 and b2 may cause the voltage of the node QBI_M to reflect the voltage of the node QBI, too. Accordingly, though the circuit block BK[m] stops driving the line L1 after the time point ta3, the voltages of the lines L1, L2 and the node QBI_M may remain to be the voltage v0, and may thus not be floating.

At a time point tu2 after the time point ta3, the selection signal LC34 may switch back to the voltage v_off from the voltage v_on. After the time point tu2, because the two selection signals LC12 and LC34 are at the voltage v_off, the switches s1 and s2 may both be off, and the drivers d1 and d2 may both be enabled, as shown in FIG. 3c. The buffer b1 and the enabled driver d1 may cause the voltages of the node QBI_U and the line L1 to reflect the voltage of the node QBI latched by the latch h1, the buffer b1 and the enabled driver d2 may cause the voltages of the node QBI_D and the line L2 to reflect the voltage of the node QBI, and the buffers b1 and b2 may cause the voltage of the node QBI_M to also reflect the voltage of the node QBI. Therefore, after the time point tu2, the voltages of the lines L1, L2 and the node QBI_M may remain to be the voltage v0, and may thus not be floating.

In another cycle T1 from time points t2 to t3 (FIG. 5), if the control-input-output circuit gctrl_io requests a circuit block BK[m'] of the circuit blocks BK[1] to BK[M0] (FIG. 2) to transmit data, the voltage of the selection signal LC12 (FIG. 5) may switch from the voltage v_off to the voltage v_on at a time point td1 to reflect that the requested circuit block BK[m'] belongs to the second group, and the voltage of the selection signal LC34 may be the voltage v_off to reflect that the circuit block BK[m'] does not belong to the first group. When the selection signal LC12 switches to the voltage v_on at the time point td1, the transistors N6 and P6 (FIG. 4) may be on, the transistors P3 and N4 may be off, and therefore the switch s2 may be on, and the driver d2 may be disabled.

After the time point td1, the signal SAT may switch from the voltage v_off to the voltage v_on at a later time point tb1, and may then cause the circuit block BK[m'] to start driving the voltage of the line L2 according to the data desired to be transmitted. For example, if the circuit block BK[m'] desires to transmit data of digital 1, then the circuit block BK[m'] may start to drive the voltage of the line L2 (and the voltage of the node QBI_D) toward a voltage v1 representing digital 1 at the time point tb1, and may eventually cause the voltage of the node QBI_D to reach the voltage v1 at a later time point tb2, as shown by the waveform vQBI_D.

After the time point td1, the switch s1 may be off, the switch s2 may be on, the driver d1 may be enabled and the driver d2 may be disabled, as shown in FIG. 3d. Hence, the voltage of the node QBI_D may be relayed to the node QBI via the switch s2 which is on, so the voltage of the node QBI may reflect the voltage of the node QBI_D, as shown by the waveform vQBI (FIG. 5). In addition, the buffer b1 and the enabled driver d1 may cause the voltages of the node QBI_U and the line L1 to reflect the voltage of the node QBI, as shown by the waveform vQBI_U; furthermore, the buffers b1 and b2 may cause the voltage of the node QBI_M to also reflect the voltage of the node QBI. Therefore, when the line L2 and the node QBI_D are driven to the voltage v1 at the time point tb2, the voltages of the nodes QBI, QBI_U, QBI_M and the line L1 may follow to be the voltage v1. Accordingly, the data of digital 1 transmitted on the line L2 by the circuit block BK[m'] may be transmitted to the control-input-output circuit gctrl_io via the node QBI_M, and may be transmitted to the line L1 via the node QBI_U.

At the time point tb2, as the nodes QBI_D and QBI are driven to the voltage v1, the voltage v1 of the node QBI may be latched by the latch h1.

At a time point tb3 after the time point tb2, the signal SAT may switch back to the voltage v_off from the voltage v_on, so the circuit block BK[m'] may stop driving the line L2. However, as shown in FIG. 3e, because the latch h1 has latched the voltage v1, the voltage of the node QBI may be kept at the voltage v1; the switch s2 which is on may cause the voltages of the node QBI_D and the line L2 to reflect the voltage of the node QBI, the buffer b1 and the enabled driver d1 may cause the voltages of the node QBI_U and the line L1 to reflect the voltage of the node QBI, and the buffers b1 and b2 may cause the voltage of the node QBI_M to reflect the voltage of the node QBI, too. Accordingly, though the circuit block BK[m'] stops driving the line L2 after the time point tb3, the voltages of the lines L1, L2 and the node QBI_M may remain to be the voltage v1, and may thus not be floating.

At a time point td2 after the time point tb3 (FIG. 5), the selection signal LC12 may switch back to the voltage v_off from the voltage v_on. After the time point td2, because the two selection signals LC12 and LC34 are at the voltage v_off, the switches s1 and s2 may both be off, and the drivers d1 and d2 may both be enabled, as shown in FIG. 3c. The buffer b1 and the enabled driver d1 may cause the voltages of the node QBI_U and the line L1 to reflect the voltage of the node QBI latched by the latch h1, the buffer b1 and the enabled driver d2 may cause the voltages of the node QBI_D and the line L2 to reflect the voltage of the node QBI, and the buffers b1 and b2 may cause the voltage of the node QBI_M to also reflect the voltage of the node QBI. Therefore, after the time point td2, the voltages of the lines L1, L2 and the node QBI_M may remain to be the voltage v1 without being floating.

To sum up, comparing to prior art, advantages of the invention may be described as follows. In the circuit module 200 of the invention, though all the circuit blocks BK[1] to BK[M] need to be coupled to the control-input-output circuit gctrl_io, the circuit blocks BK[1] to BK[M] are not coupled to the control-input-output circuit gctrl_io by a long line extending across the circuit blocks BK[1] to BK[M]; instead, the circuit blocks BK[1] to BK[M] may be organized into the first group (including the circuit blocks BK[M0+1] to BK[M]) and the second group (including the circuit blocks BK[1] to BK[M0]) coupled to the middle circuit 210 respectively by the two short lines L1 and L2, and may then be coupled to the control-input-output circuit gctrl_io via the middle circuit 210. According to this architecture, each of the lines L1 and L2 may not need to extend across all the circuit blocks BK[1] to BK[M], and may just need to extend across a smaller subset of the circuit blocks BK[1] to BK[M]; therefore, the lengths of the lines L1 and L2 may be shorter with lower equivalent load, time required for anyone of the circuit blocks BK[1] to BK[M] to drive the corresponding line L1 or L2 may be shorter, and speed of data access may be faster. In addition, because of lowered line load, layout area of driver circuitry embedded in each of the circuit blocks BK[1] to BK[M] for driving the line L1 or L2 may be reduced.

When one of the circuit blocks BK[1] to BK[M] (e.g., BK[m] or BK[m'] in FIG. 3a or 3d) desires to transmit data to the control-input-output circuit gctrl_io, driving only one short line (L1 or L2) to a corresponding data-representing voltage (v0 or v1) by said circuit block will be sufficient for the control-input-output circuit gctrl_io to successfully receive said data; even if the other short line (L2 or L1) is driven to the data-representing voltage at a later time by the middle circuit 210, data receiving of the control-input-output circuit gctrl_io will not be affected. In other words, the circuit module 200 according to the invention may have better margin(s) for timing of data access, and may help to increase speed of data access.

Furthermore, after the signal SAT (FIG. 5) is at the voltage v_on to cause one of the circuit blocks BK[1] to BK[M] to drive the corresponding line L1 or L2 to the data-representing voltage, even when the signal SAT switches back to the voltage v_off to cause the lines L1 and L2 not to be driven by the circuit block BK[1] to BK[M] anymore, the middle circuit 210 may keep the lines L1, L2 and the node QBI_M at the data-representing voltage without being left floating, as shown in FIGS. 3b, 3c and 3e. Therefore, data hold-time at the node QBI_M will be satisfactorily sufficient.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A circuit module with improved line load, comprising:
   a first line;
   a first switch coupled between the first line and a first node, being on and off to conduct and stop conducting between the first line and the first node;
   a second line;
   a second switch coupled between the second line and the first node, being on and off to conduct and stop conducting between the second line and the first node; and
   a second driver comprising a second-driver input terminal and a second-driver output terminal respectively coupled to a second node and the second line; the second driver being enabled to drive the second line according to a voltage of the second node and to thereby cause a voltage of the second line to change when the voltage of the second node changes, and being disabled to stop driving the second line; wherein:
   the voltage of the second node is controlled by a voltage of the first node;
   when the first switch is on, the second switch is off; and
   when the second switch is off, the second driver is enabled.

2. The circuit module of claim 1, wherein:
   when the second switch is on, the first switch is off.

3. The circuit module of claim 1, wherein:
   when the second switch is on, the second driver is disabled.

4. The circuit module of claim 1 further comprising:
   a buffer comprising a buffer input terminal and a buffer output terminal respectively coupled to the first node and the second node.

5. The circuit module of claim 4, wherein the buffer further comprises a first inverter coupled between the buffer input terminal and the buffer output terminal.

6. The circuit module of claim 1 further comprising:
   one or more first circuit blocks coupled to the first line;
   wherein when one of said one or more first circuit blocks transmits data, the one of said one or more first circuit blocks drives the first line according to the data after the first switch is on, and stops driving the first line before the first switch turns off.

7. The circuit module of claim 6, wherein each of said one or more first circuit blocks is a memory bank.

8. The circuit module of claim 6 further comprising:
a latch coupled to the first node; wherein after the one of said one or more first circuit blocks stops driving the first line, the latch maintains the voltage of the first node such that the voltage of the first node is not floating.

9. The circuit module of claim 8, wherein the latch comprises:
a third inverter comprising a third-inverter input terminal and a third-inverter output terminal respectively coupled to the first node and an internal node; and
a fourth inverter comprising a fourth-inverter input terminal and a fourth-inverter output terminal respectively coupled to the internal node and the first node.

10. The circuit module of claim 1, wherein: during an interval, the first switch and the second switch are both off, and the second driver is enabled.

11. The circuit module of claim 1 further comprising:
one or more second circuit blocks coupled to the second line;
wherein when one of said one or more second circuit blocks transmits data, the one of said one or more second circuit blocks drives the second line according to the data after the second switch is on, and stops driving the second line before the second switch turns off.

12. The circuit module of claim 11, wherein each of said one or more second circuit blocks is a memory bank.

13. The circuit module of claim 1 further comprising:
a first driver comprising a first-driver input terminal and a first-driver output terminal respectively coupled to the second node and the first line; the first driver being enabled to drive the first line according to the voltage of the second node, and being disabled to stop driving the first line; wherein:
when the second switch is on, the first switch is off; and
when the first switch is off, the first driver is enabled; and
during an interval, the first switch and the second switch are off, and the first driver and the second driver are enabled.

14. The circuit module of claim 13, wherein:
when the first switch is on, the first driver is disabled.

15. The circuit module of claim 13, wherein the first driver further comprises:
a first transistor comprising a first controlled terminal and a first channel terminal;
a second transistor comprising a second controlled terminal and two second channel terminals, the two second channel terminals being coupled to the first channel terminal and the first-driver output terminal respectively;
an eighth transistor comprising an eighth controlled terminal and an eighth channel terminal; and
a seventh transistor comprising a seventh controlled terminal and two seventh channel terminals, the two seventh channel terminals being coupled to the eighth channel terminal and the first-driver output terminal respectively; wherein:

one of the first controlled terminal and the second controlled terminal is coupled to the first-driver input terminal, and the other one of the first controlled terminal and the second controlled terminal is coupled to a first inverse selection signal;
one of the seventh controlled terminal and the eighth controlled terminal is coupled to the first-driver input terminal, and the other one of the seventh controlled terminal and the eighth controlled terminal is coupled to a first selection signal; and
the first selection signal and the first inverse selection signal are mutually inverse.

16. The circuit module of claim 15, wherein the first switch comprises:
a fifth transistor comprising a fifth controlled terminal and two fifth channel terminals respectively coupled to the first selection signal, the first node and the first line.

17. The circuit module of claim 15, wherein the first switch comprises:
an eleventh transistor comprising an eleventh controlled terminal and two eleventh channel terminals respectively coupled to the first inverse selection signal, the first node and the first line.

18. The circuit module of claim 1, wherein the second driver further comprises:
a third transistor comprising a third controlled terminal and a third channel terminal;
a fourth transistor comprising a fourth controlled terminal and two fourth channel terminals, the two fourth channel terminals being coupled to the third channel terminal and the second-driver output terminal respectively;
a tenth transistor comprising a tenth controlled terminal and a tenth channel terminal; and
a nineth transistor comprising a nineth controlled terminal and two nineth channel terminals, the two nineth channel terminals being coupled to the tenth channel terminal and the second-driver output terminal respectively; wherein:
one of the third controlled terminal and the fourth controlled terminal is coupled to the second-driver input terminal, and the other one of the third controlled terminal and the fourth controlled terminal is coupled to a second inverse selection signal;
one of the nineth controlled terminal and the tenth controlled terminal is coupled to the second-driver input terminal, and the other one of the nineth controlled terminal and the tenth controlled terminal is coupled to a second selection signal; and
the second selection signal and the second inverse selection signal are mutually inverse.

19. The circuit module of claim 18, wherein the second switch comprises:
a sixth transistor comprising a sixth controlled terminal and two sixth channel terminals respectively coupled to the second selection signal, the first node and the second line.

20. The circuit module of claim 18, wherein the second switch comprises:
a twelfth transistor comprising a twelfth controlled terminal and two twelfth channel terminals respectively coupled to the second inverse selection signal, the first node and the second line.

* * * * *